United States Patent
Aoyama et al.

(10) Patent No.: US 7,148,426 B2
(45) Date of Patent: Dec. 12, 2006

(54) LEAD-FREE SOLDER, AND CONNECTION LEAD AND ELECTRICAL COMPONENT USING SAID LEAD-FREE SOLDER

(75) Inventors: Seigi Aoyama, Ibaraki (JP); Takaaki Ichikawa, Ibaraki (JP); Hiromitsu Kuroda, Ibaraki (JP); Takashi Nemoto, Ibaraki (JP); Atsushi Ohtake, Ibaraki (JP); Hiroyoshi Hiruta, Ibaraki (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 09/892,630

(22) Filed: Jun. 28, 2001

(65) Prior Publication Data
US 2003/0024733 A1   Feb. 6, 2003

(30) Foreign Application Priority Data
Mar. 6, 2001   (JP)   ............................... 2001-61650

(51) Int. Cl.
*H05K 1/16*   (2006.01)
*C22C 13/00*   (2006.01)
(52) U.S. Cl. ...................... 174/260; 174/262; 174/263; 420/560; 420/561
(58) Field of Classification Search .............. 174/261, 174/263, 267; 361/776–779; 148/23–26, 148/434, 500; 228/56.3, 180.1, 180.5, 180.22; 420/559–566, 471–476, 571; 428/647–648, 428/675
See application file for complete search history.

(56) References Cited

U.S. PATENT DOCUMENTS 5,690,890 A * 11/1997 Kawashima et al. ......... 420/559
5,817,194 A * 10/1998 Nagai et al. ................. 148/400
6,033,488 A * 3/2000 An et al. ....................... 148/24
6,319,461 B1 * 11/2001 Domi et al. ................. 420/557
6,475,643 B1 * 11/2002 Hasegawa et al. .......... 428/647

FOREIGN PATENT DOCUMENTS

JP             03255637 A    * 11/1991
JP             2000-25388       2/1999
JP             2000-288772      2/2000

OTHER PUBLICATIONS

Hawlry's Condensed Chemical Dictionary, Thirteen Edition, p. 84 & 85.*

* cited by examiner

*Primary Examiner*—Tuan Dinh
(74) *Attorney, Agent, or Firm*—Antonelli, Terry, Stout & Kraus, LLP

(57) ABSTRACT

In a lead-free solder comprising an alloy composition composed mainly of tin, the alloy composition further contains 0.002 to 0.015% by mass of phosphorus. This lead-free solder can be used as a plating in a connection lead comprising: a copper strip or other strip conductor; and the plating provided on at least one side of the strip constructor, the plating having a shape such that the plating in the widthwise direction of the strip conductor has a bulge as viewed in section with the apex being located at a proper position in the widthwise direction of the strip conductor. By virtue of this constitution, the lead-free solder on its surface is less likely to be oxidized, and the connection lead has excellent bond strength owing to the property of the lead-free solder and, in addition, has the function of breaking the formed oxide layer and the function of removing included gas bubbles and can eliminate the need to form the plating in very large thickness. Further, the lead-free solder can be used as a connection element in an electrical component that is less likely to cause oxidation of the connection element on its surface and, thus, can have a strong connection structure by the connection element.

2 Claims, 4 Drawing Sheets

PRIOR ART  FIG.7B

LEAD-FREE SOLDER, AND CONNECTION LEAD AND ELECTRICAL COMPONENT USING SAID LEAD-FREE SOLDER

FIELD OF THE INVENTION

The invention relates to a lead-free solder, and a connection lead and an electrical component using said lead-free solder, and more particularly to a lead-free solder having a highly oxidation-resistant surface, a connection lead, which has excellent bond strength owing to the property of the lead-free solder and, in addition, has the function of breaking the formed oxide layer and the function of removing included gas bubbles and can eliminate the need to form a plating in very large thickness, and an electrical component which, by virtue of the application of the lead-free solder, is less likely to cause oxidation of the connection element on its surface and, thus, can realize a strong connection structure by the connection element.

BACKGROUND OF THE INVENTION

A semiconductor chip comprising a silicon crystal grown on a substrate has been utilized as a solar battery. The construction of this solar battery is generally such that a connection lead is joined to a silicon crystal wafer in its predetermined region and electricity is output through the connection lead. In general, a solder plating is provided on the surface of the connection lead, for connection to the wafer.

A tin-lead-alloy-base solder is a classical material which has been actually used in other electrical components and has also been used to constitute the solder plating. In recent years, however, due to a fear that lead adversely affects the environment, studies have been made on the substitution of other lead-free solder, for plating, for this tin-lead-alloy-base solder.

The tin-lead-base solder, which has hitherto been extensively used, is a highly useful plating material characterized, for example, by excellent wettability, high bond strength, or good handleability while ensuring, for example, the electrical conductivity or mechanical strength possessed by the lead. Therefore, solder plating materials alternative to the tin-lead-base solder should be satisfactory in these various properties.

For example, tin-silver-base, tin-bismuth-base, and tin-copper-base solders have hitherto been regarded as promising lead-free plating material alternative to the tin-lead-base solder, and are expected to be utilized as a connection element in a large number of electrical components including materials for constituting the plating for joining a connection lead in the above-described solar battery.

FIG. 6 is a schematic diagram showing an example of the construction of a solar battery. In this drawing, numeral 1 designates a silicon wafer which receives sunlight and outputs electricity, and numeral 2 a silver-plated portion provided on the silicon wafer 1 in its narrowest possible restricted area in a predetermined region for high power output. A connection lead 3 is connected so as to be in the region of the silver-plated portion 2.

FIG. 7A shows the construction of the connection lead 3. The connection lead 3 comprises a copper strip 4 and a solder plating 5 provided on both sides of the copper strip 4. For example, this copper strip 4 has a thickness t1 of about 0.125 mm and a width W1 of about 1.5 mm, and on the other hand, the plating 5 has a thickness t2 of about 20 to 30 μm.

In the above construction, the connection lead, wherein the plating 5 formed of, for example, the above-described tin-silver-base, tin-bismuth-base, or tin-copper-base system has been provided in the joint, has a high level of properties as a lead using the solder free from lead, i.e., the so-called "lead-free solder," and has been properly appreciated.

According to the conventional lead-free solder, however, an oxide layer is likely to be formed on the surface of the solder during production or use of the solder. In particular, heating for the connection of the connection lead 3 to the silver-plated portion 2 results in quick oxidation of the solder plating 5 which disadvantageously makes it difficult to provide predetermined bond strength.

This is a problem inherent in the lead-free solder and caused due to the fact that, since the solder is free from lead, the liquidus line is shifted to a higher temperature side which necessitates increasing the heating temperature. However, the problem of unsatisfactory bond strength is attributable to the material, as well as to the construction of the connection lead 3.

This will be explained in conjunction with FIG. 7B. FIG. 7B shows the state of connection of the connection lead 3 to the silver-plated portion 2. The plating 5 provided on the copper strip 4 is heat-melted and pressed against the silver-plated portion 2, whereby the connection lead 3 is joined to the silver-plated portion 2. In this case, an oxide layer (not shown) formed on the solder plating 5 upon heating is highly likely not to be broken by the pressing, and, consequently, adversely affects the state of connection. This is also a great factor in the unsatisfactory bond strength.

The problem of the unsatisfactory bond strength in its turn adversely affects other properties. Specifically, in the conventional connection lead for use in solar batteries, the plating 5 is generally designed to be thick so that the lack of bond strength is compensated for by the amount of the solder. Increasing the amount of solder, however, means that the solder flows out to a portion outside the predetermined region. For this reason, as indicated by A in FIG. 7B, the silicon wafer 1 is partially covered with solder flowed out from the silver-plated portion 2. This poses a problem of lowered power output efficiency of the solar battery.

Another problem involved in the structure of the connection lead 3 is the inclusion of gas bubbles in the solder joint. The construction of the lead 3, wherein the oxide layer formed on the solder plating 5 cannot be broken at the time of heat connection, leads to the inclusion of air due to the lack of fluidity of the plating 5. The inclusion of gas bubbles is causative of an increase in connection resistance which is in turn causative of a lowering in output efficiency of generated electric power.

Among the above-described problems, the formation of the oxide layer on the surface is not a problem involved in only solar batteries and is also a serious problem in other electrical components.

More specifically, the formation of the oxide layer is also evidently unfavorable in electrical components provided with a lead-free solder as a connection element, for example, printed boards having a lead-free soldered portion formed by flow or reflow, ball grid array-type printed boards having a plurality of lead-free solder balls arranged as terminals, single wires, twisted wires, and served shield wires, for electric wires, having a lead-free solder plating formed on the surface thereof, and a coaxial cable for medical or personal computer applications, comprising: an internal conductor of an extrafine alloy wire in a single wire or twisted wire form; an external conductor, of an extrafine alloy wire, provided on the internal conductor through an insulator; and a lead-free solder plating provided on the surface of the internal conductor and the surface of the external conductor, and this is causative of deteriorated product stability and reliability.

SUMMARY OF THE INVENTION

Accordingly, it is an object of the invention to provide a lead-free solder having a highly oxidation-resistant surface.

It is another object of the invention to provide a connection lead which is provided with a plating formed of a lead-free solder having a highly oxidation-resistant surface, permits the oxide layer formed on the surface of the plating to be easily broken and, thus, has advantageous properties, that is, can eliminate the adverse effect of the oxide layer on the bond strength and can eliminate the need to form a plating having very large thickness, and, at the same time, can suppress the increase in connection resistance through the removal of included gas bubbles at the time of connection.

It is a further object of the invention to provide an electrical component wherein a lead-free solder having a highly oxidation-resistant surface has been applied as a connection element to constitute a strong connection structure through the connection element.

According to the first feature of the invention, a lead-free solder comprises an alloy composition composed mainly of tin, said alloy composition containing 0.002 to 0.015% by mass of phosphorus.

According to the second feature of the invention, a connection lead comprises: a copper strip or other strip conductor; and a plating provided on at least one side of the strip constructor, said plating being formed of a lead-free solder composed mainly of tin, said plating containing 0.002 to 0.015% by mass of phosphorus and having a shape such that the plating in the widthwise direction of the strip conductor has a bulge as viewed in section with the apex being located at a proper position in the widthwise direction of the strip conductor.

According to the third feature of the invention, an electrical component structure comprising a connection element formed of a lead-free solder composed mainly of tin, said connection element containing 0.002 to 0.015% by mass of phosphorus.

The greatest characteristic feature of the invention is that the incorporation of phosphorus as a component can constitute a lead-free solder which is less likely to form an oxide layer. To this end, the phosphorus content should be limited to 0.002 to 0.015% by mass. When the phosphorus content is less than 0.002% by mass, the effect of suppressing the formation of oxide layer can be unsatisfactory. On the other hand, when the phosphorus content exceeds 0.015% by mass, the concentration of phosphorus becomes uneven in the production of the solder and, thus, this makes it impossible to produce a lead-free solder having homogeneous properties. For this reason, the phosphorus content is limited to the above defined range.

The following chemical compositions may be mentioned as specific and preferred examples of chemical compositions of the lead-free solder according to the invention.

It should be noted that a bismuth-containing, lead-free solder is unfavorable because this solder deteriorates the thermal fatigue properties at the joint.

CHEMICAL COMPOSITION EXAMPLE 1

Silver: 2.0 to 5.0 mass %
Copper: 0.01 to 2.0 mass %
Phosphorus: 0.002 to 0.015 mass %
Tin: Balance

CHEMICAL COMPOSITION EXAMPLE 2

Copper: 0.01 to 2.0 mass %
Phosphorus: 0.002 to 0.015 mass %
Tin: Balance

In the connection lead according to the invention, the plating formed of the lead-free solder is provided so as to have a bulge as viewed in section with the apex being located at a proper position in the widthwise direction of the strip conductor. The reason for this is as follows. Upon pressing of the connection lead to an object to be connected, the heat-melted plating formed of the lead-free solder is flowed toward both sides of the strip conductor. This permits the oxide layer formed on the surface of the plating to be efficiently broken and, at the same time, permits gas bubbles included at the time of flow to be efficiently removed toward both sides of the lead.

Accordingly, the bulge is preferably in such a form as will effectively exhibit the above function, and, in many cases, the bulge is provided in an arc form such that the center portion in the widthwise direction of the strip conductor is bulged. Shapes other than arc include: a triangle wherein the apex is located at the center portion in the widthwise direction of the strip conductor; and stairs with several steps wherein the apex is located at the center portion. The effect of breaking the oxide layer and the effect of removing gas bubbles contemplated in the invention can also be attained by adopting these shapes.

Further, a construction may also be adopted such that a plurality of bulges are formed in the widthwise direction of the strip conductor. According to this construction, the formed oxide layer can be broken at a plurality of positions and thus can increase the area of pure solder exposed from under the oxide layer and can enhance the effect of removing included gas bubbles.

In many cases, the lead-free solder plating is formed on both sides of the strip conductor. Alternatively, for some applications of the connection lead, the lead-free solder plating may be formed on only one side of the strip conductor.

In the former case, both sides of the strip conductor may be exposed. In the case where the strip conductor should be protected against the external action, however, it is preferred to adopt a construction such that the strip conductor is covered with the lead-free solder for constituting the plating.

Connection elements in the electrical component according to the invention include, for example, a plating provided on a lead in a connection structure for connecting a lead to predetermined regions of a wafer in a solar battery, the soldered portion in the printed board having a soldered portion formed in predetermined sites by flow or reflow, and the solder balls in ball grid array-type printed boards having a plurality of solder balls arranged as terminals on the surface thereof.

Additional examples of connection elements in the electrical component according to the invention include the plating in single wires, twisted wires, and served shield wires, for electric wires, having a plating formed on the surface thereof, and the plating on the internal conductor and the external conductor in the coaxial cable comprising: an internal conductor in a single wire or twisted wire form; and an external conductor provided on the internal conductor through an insulator. In all the above cases, when the connection element is formed of a lead-free solder, the prevention of the formation of the oxide layer and the elimination of the influence of the lack of bond strength caused by the formation of the oxide layer have been strongly desired in the art. Therefore, the construction of these connection elements using the lead-free solder according to the invention, which can meet these requirements, is very valuable from the viewpoint of technology.

BRIEF DESCRIPTION OF THE DRAWINGS

The invention will be explained in more detail in conjunction with the appended drawings, wherein:

FIGS. 2A and 2B are explanatory views showing the mechanism of connection of the connection lead shown in FIG. 1, wherein FIG. 2A shows the state of the connection lead before connection and FIG. 2B shows the state of the connection lead after connection;

FIGS. 7A and 7B are diagrams illustrating the construction of a conventional connection lead, wherein FIG. 7A is a cross-sectional view of the conventional connection lead and FIG. 7B shows the state of connection of the conventional connection lead to a solar battery.

DESCRIPTION OF THE PREFERRED EMBODIMENTS

Preferred embodiments of the invention will be explained in conjunction with the accompanying drawings.

Figure 1:
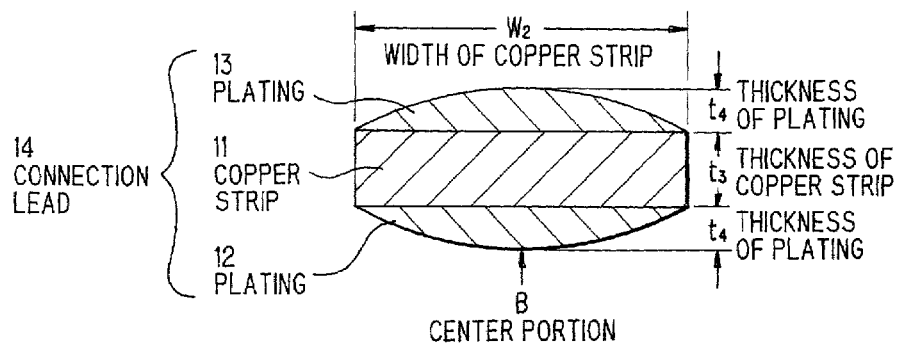
FIG. 1 is an explanatory view showing a preferred embodiment of the connection lead according to the invention.

FIG. 1 shows a preferred embodiment of the connection lead according to the invention. In the drawing, numeral 14 designates a connection lead, numeral 11 a copper strip, and numerals 12 and 13 platings, formed of the lead-free solder according to the invention, provided respectively on both sides of the copper strip 11. In this case, each of the platings is in an arc sectional form such that the apex is located at the center portion B in the widthwise direction of the copper strip 11.

Figure 2A:
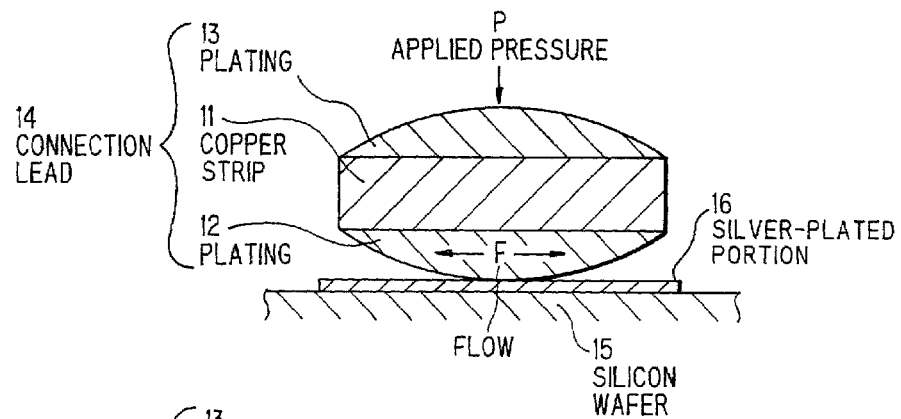
Figure 6:
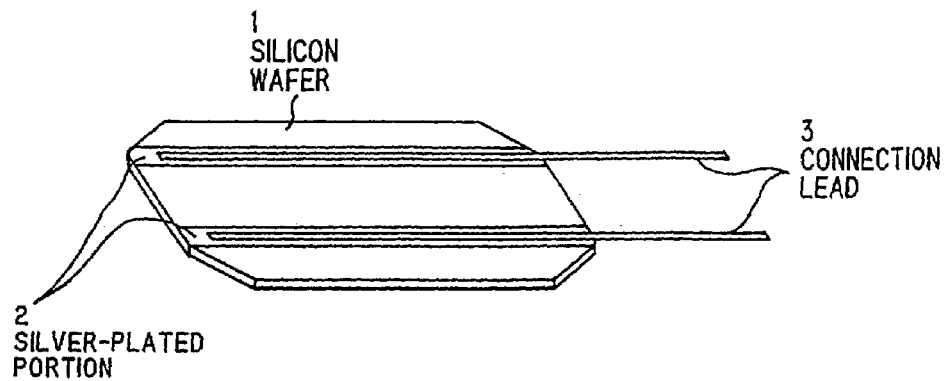
FIG. 6 is a schematic diagram illustrating an example of the construction of a solar battery.

FIG. 2 is a diagram showing a construction wherein the connection lead 14 shown in FIG. 1 has been applied to a lead connection structure in a solar battery of the same type as shown in FIG. 6. As is demonstrated in the experimental results below, the lead-free solder, according to the invention, constituting the plating 12 is less likely to form an oxide layer and can be connected, with good bond strength, to a silver-plated portion 16 on a silicon wafer 15. At the outset, as shown in FIG. 2A, the connection lead 14 is pushed against the silver-plated portion 16 by applying a pressure P.

Upon the pressing of the connection lead 14 against the silver-plated portion 16, the lower plating 12, which has an arc sectional form and has been heat melted, is flowed in a direction as indicated by an arrow F. This permits the oxide layer formed on the surface of the plating 12 (even though the oxide layer has been formed as a result of high-temperature heating; not shown) to be broken by this flow, whereby a pure solder component is exposed from under the oxide layer and is applied to the connection to the silver-plated portion 16.

As a result, high bonding power is created between the plating 12 and the silver-plated portion 16 by virtue of a synergistic effect attained by the property of the plating 12, i.e., less tendency to produce an oxide layer, and the above oxide layer breaking mechanism. Thus, a connection structure with predetermined bond strength is formed between the plating 12 and the silver-plated portion 16.

Further, the flow of the plating 12 takes place in the direction indicated by the arrow F, and, thus, as the thickness of the plating 12 is reduced by the pressure P, gas bubbles included at the time of flow of the plating are forced in the direction F and are effectively removed. This can effectively solve the problem of an increase in connection resistance attributable to the inclusion of gas bubbles, which is a problem of the conventional connection structure, and the problem of lowered power output efficiency caused by the increased connection resistance.

Figure 2B:
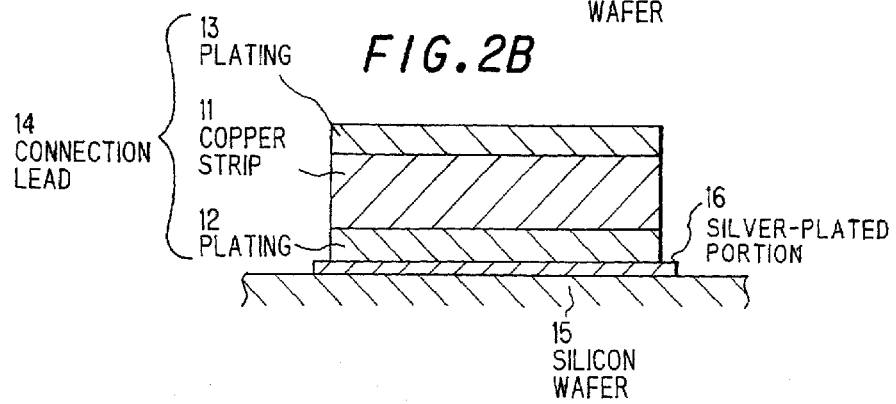
Figure 7A:
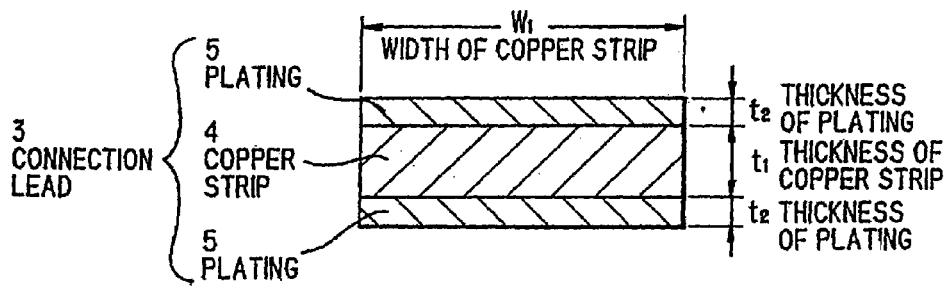
Figure 7A:
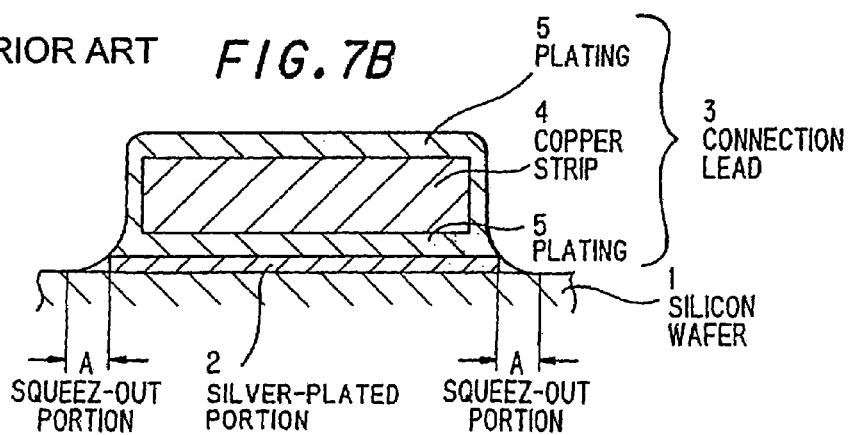

FIG. 2B is a cross-sectional view showing the structure after the completion of the connection. When the realization of high bond strength achieved by the invention is taken into consideration, unlike the conventional plating required to have very large thickness, the thickness of the plating 12 according to the invention may be small. Therefore, the plating 12 can be surely in the region of the silver-plated portion 16. This can solve the problem of lowered power output efficiency caused by the formation of a plating flowed-out portion A as shown in FIG. 7B. It should be noted that, upon heating, the upper plating 13 becomes flowable and consequently becomes flat as shown in the drawing.

Figure 3:
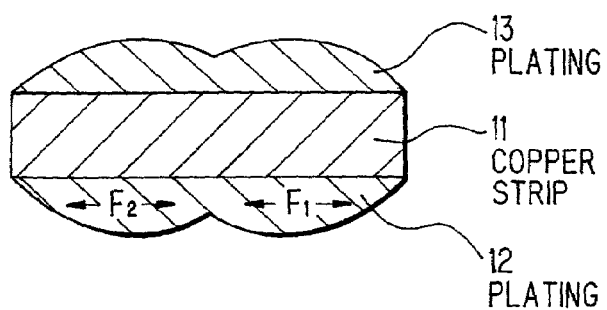
FIG. 3 is an explanatory view showing another preferred embodiment of the connection lead according to the invention.

FIG. 3 shows another preferred embodiment of the connection lead according to the invention. In this preferred embodiment, two bulges are provided in each of the platings 12 and 13. The provision of the two bulges in each of the platings 12 and 13 can create flow in two directions F2 and F3 upon the application of pressure. Therefore, the formed oxide layer is broken in more sites, and, thus, an increase in exposed solder sites and an improvement in the effect of removing included gas bubbles can be expected.

Figure 4:
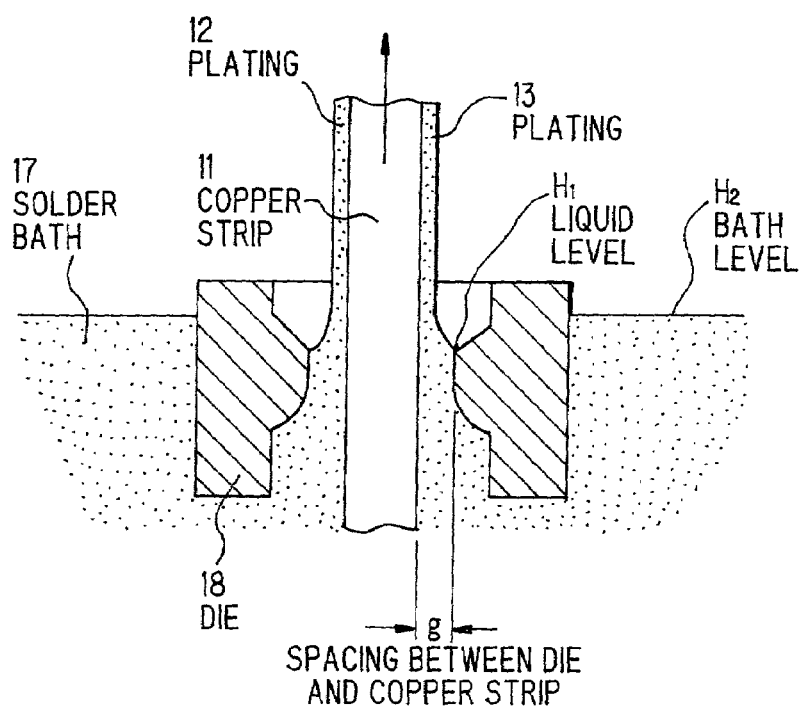
FIG. 4 is an explanatory view showing an embodiment of an apparatus for the production of the connection lead according to the invention.

FIG. 4 shows the principal part of an apparatus for the production of the connection lead shown in FIG. 1.

A die 18 is placed in a solder bath 17. The surface of the solder bath 17 is covered with a non-oxidizing gas. A copper strip 11, which has been passed through the solder bath 17 from under the bath, is passed through the die 18 and is then pulled up upward. As a result, solder is deposited to form platings 12 and 13. The solder level H1 at the outlet is always kept below the solder level H2 in the solder bath 17.

The shape and thickness t4 of the arc in the platings 12 and 13 shown in FIG. 1 may be regulated by varying the thickness t3 and width W2 of the copper strip 11, the temperature of the solder bath 17, the pull-up speed of the copper strip 11, the spacing g between the die 18 and the copper strip 11, the shape of the die 18, and the surface tension of the solder bath 17. Among these parameters, the surface tension of the solder bath 17 has a great influence on the shape and thickness of the arc in the platings 12 and 13.

Next, less susceptibility of the platings 12 and 13 to the formation of an oxide layer in the connection lead according to the preferred embodiment of the invention produced by the apparatus shown in FIG. 4 will be explained. Table 1 shows the results of the following experiment. Specifically, two types of copper strips 11 as shown in FIG. 1, a copper strip having a dimension of t3=0.160 mm×W2=2.0 mm and a copper strip having a dimension of t3=0.150 mm×W2=1.5 mm, were provided. For each of these copper strips, platings 12 and 13 formed of a phosphorus-containing, lead-free solder and platings 12 and 13 of a phosphorus-free, lead-free solder were formed by the apparatus shown in FIG. 4. The samples thus obtained were subjected to a heating test, and the level of the formed oxide layer was compared.

The phosphorus-containing, lead-free solder according to the invention had a chemical composition of tin-3.0 mass % silver-0.5 mass % copper-0.01 mass % phosphorus. On the other hand, the conventional phosphorus-free, lead-free solder had a chemical composition of tin-3.0 mass % silver-0.5 mass % copper. The melting property of these solders was confirmed by means of a differential scanning calorimeter (DSC). As a result, these two solders had the same properties, that is, the melting start temperature was 217.2° C., and the melt peak temperature was 220° C.

In the heating test, the samples were placed on a hot plate, and were heated at a predetermined temperature for one min. In this case, the samples were inspected for the formation of an oxide layer on the platings 12 and 13. The formation of the oxide layer can be easily confirmed by a change in color of the surface of the plating. In the table, ○ represents that no change in color took place; Δ represents that a slight change in color took place; and X represents that a significant change in color took place.

TABLE 1

| Size of copper strip 11, mm | — | P | Heating temp., ° C. | | | |
|---|---|---|---|---|---|---|
| | | | 200 | 250 | 300 | 350 |
| 0.160 × 2.0 | Invention | Present | ○ | ○ | ○ | Δ |
| | Conventional | Absent | ○ | X | X | X |
| 0.150 × 1.5 | Invention | Present | ○ | ○ | ○ | Δ |
| | Conventional | Absent | ○ | X | X | X |

As is apparent from Table 1, the connection leads according to the invention do not form an oxide layer at temperatures up to 300° C., and the oxide layer was slightly formed at 350° C. On the other hand, for the comparative samples of the conventional technique, the oxide layer was significantly formed even at 250° C. Thus, there was a significant difference in the formation of oxide layer between the samples of the invention and the comparative samples.

Figure 5:
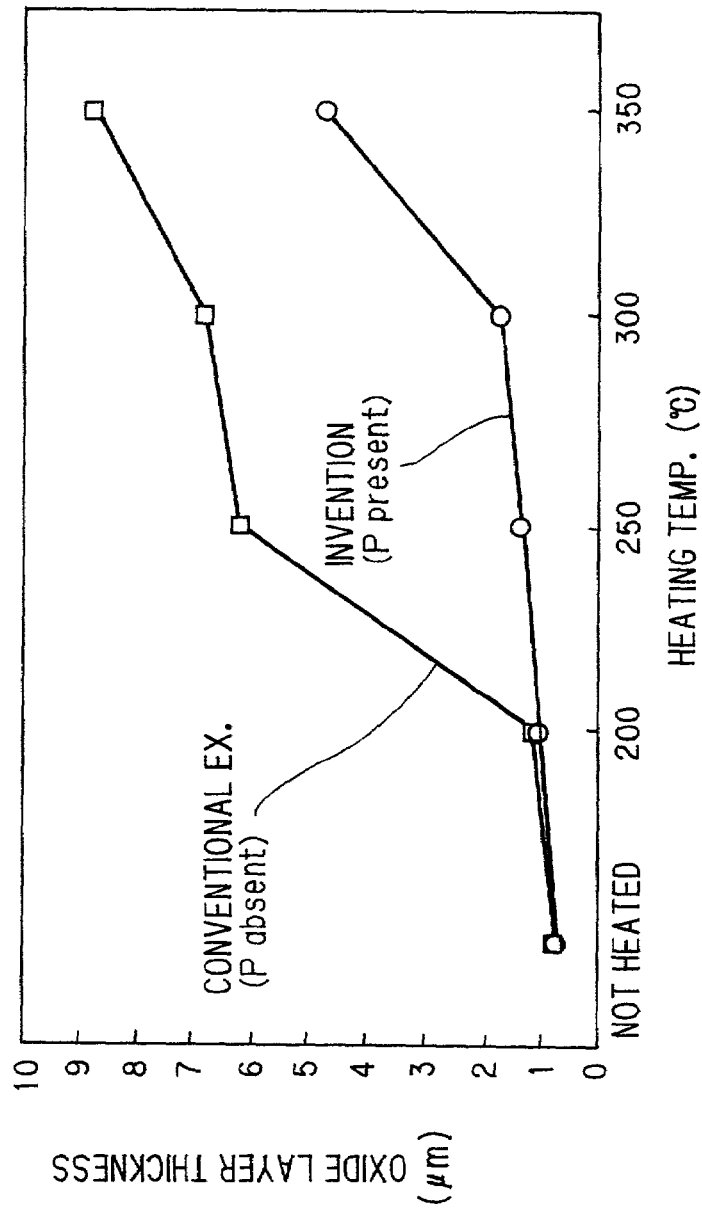
FIG. 5 is a diagram illustrating the relationship between the heating temperature and the thickness of the formed oxide layer in a connection lead using a lead-free solder according to the invention and a connection lead using a conventional lead-free solder.

FIG. 5 shows the results of the measurement of the thickness of the oxide layer formed on the plating by Auger analysis. As is apparent from this drawing, the comparative sample of the conventional technique caused a rapid increase in thickness (6 μm) of oxide layer at 250° C., whereas, for the sample of the invention, the thickness of oxide layer was as small as less than 2 μm even at 300° C. This clearly supports the test results shown in Table 1, and significantly demonstrates the effect of the invention.

The relationship between the content of phosphorus in the lead-free solder according to the invention and the formation of an oxide layer is summarized in Table 2. The heating test was carried out in the same manner as explained above. Further, in the table, ○, Δ, and X have the same meaning as explained above.

TABLE 2

| Constituents except for P, mass % | P content, mass % | Heating temp., ° C. | | | |
|---|---|---|---|---|---|
| | | 200 | 250 | 300 | 350 |
| Sn-3.0Ag-0.5Cu | 0 | ○ | X | X | X |
| | 0.001 | ○ | X | X | Δ |
| | 0.002 | ○ | ○ | ○ | Δ |
| | 0.010 | ○ | ○ | ○ | Δ |
| | 0.015 | ○ | ○ | ○ | ○ |
| Sn-0.7Cu | 0 | ○ | X | X | X |
| | 0.001 | ○ | X | X | Δ |
| | 0.002 | ○ | ○ | ○ | Δ |
| | 0.010 | ○ | ○ | ○ | Δ |
| | 0.015 | ○ | ○ | ○ | ○ |
| Sn-2.0Ag-0.1Cu | 0.01 | ○ | ○ | ○ | Δ |
| Sn-0.05Cu | 0.01 | ○ | ○ | ○ | Δ |
| Sn-0.2Cu | 0.01 | ○ | ○ | ○ | Δ |

As is apparent from Table 2, for all the lead-free solders having a chemical composition of tin-silver-copper (except for phosphorus) and a chemical composition of tin-copper (except for phosphorus), when the phosphorus content was 0 or 0.001% by mass, the level of a change in color was significant (X) at 250° C., indicating that the oxide layer was significantly formed. On the other hand, when the phosphorus content was 0.002 to 0.015% by mass, the level of a change in color was slight (Δ) at 350° C., or there was no change in color (○) even at 350° C.

Thus, the above results clearly show that the lower limit of the phosphorus content, 0.002% by mass, is of critical importance to the invention.

In the production of solar batteries, after soldering of a plane line of solder plating to a silicon substrate, sealing with EVA (ethylene vinyl acetate) is in some cases performed. In this case, when the solder is in the oxidized state, there occur problems, for example, separation of EVA from solder. These problems can be overcome by using the lead-free solder according to the invention.

Further, as can be easily estimated from the results shown in Tables 1 and 2 and FIG. 5, the application of the lead-free solder according to the invention to connection elements, for example, a soldered portion formed by flow or reflow in a printed board, or solder balls constituting a terminal portion in a ball grid array-type printed board can provide electrical components provided with connection elements having excellent bond strength based on the property of the lead-free solder according to the invention, that is, less susceptibility to the formation of an oxide layer.

Further, leads using the tin-silver-copper-base solder and leads using the tin-copper-base solder applied to the above test and leads using solders having the same chemical composition as these solders except for the addition of a very small amount of bismuth were provided. These leads were joined to a silver electrode in a silicon wafer. The products thus obtained were subjected to a thermal cycling test. Thereafter, these products were evaluated for the peel strength of the joint. The results are shown in Table 3. The thermal cycling test was carried out as follows. The sample was allowed to stand at −30° C. for one hr, and was then heated to 80° C. and allowed to stand at that temperature for one hr. This procedure was repeated 100 cycles. After the test, the wafer was separated from the lead. At that time, the peel strength was measured. The peel strength was also measured before the test. Based on these data, a lowering in peel strength was evaluated.

As is apparent from Table 3, for the bismuth-containing leads, as compared with the bismuth-free leads, the peel strength was significantly lowered by the thermal cycling test. This demonstrates that the application of bismuth-containing, lead-free solder plating to leads is unfavorable from the viewpoint of long-term reliability.

TABLE 3

| Constituents except for P, Bi, mass % | P content, mass % | Bi content, mass % | Lowering in peel strength* |
|---|---|---|---|
| Sn-3.0Ag-0.5Cu | 0.002 | — | 3% |
| | 0.010 | — | 5% |
| | 0.015 | — | 5% |
| Sn-0.7Cu | 0.002 | — | 2% |
| | 0.010 | — | 5% |
| | 0.015 | — | 5% |
| Sn-3.0Ag-0.5Cu | 0.002 | 1.0 | 21% |
| | 0.010 | 3.0 | 25% |
| | 0.015 | 5.0 | 30% |
| Sn-0.7Cu | 0.002 | 1.0 | 22% |
| | 0.010 | 3.0 | 26% |
| | 0.015 | 5.0 | 30% |

Note)
*[(Peel strength before test - Peel strength after test)/Peel strength before test] × 100

As is apparent from the foregoing description, according to the invention, the incorporation of 0.002 to 0.015% by mass of phosphorus into a lead-free solder composed mainly of tin can provide a useful solder which is less likely to form an oxide layer. This effect is very useful for enhancing the reliability of lead-free solders. Further, according to the invention, the application of this lead-free solder to a plating in connection leads and, at the same time, the formation of this plating so as to have a bulge as viewed in section with the apex being located at a proper position in the widthwise direction of a strip conductor can provide connection leads that can easily break the formed oxide layer and remove included gas bubbles and can eliminate the need to form the plating in very large thickness. Furthermore, the application of the above lead-free solder to connection elements in electrical components can provide electrical components provided with connection elements having excellent bond strength. Thus, the effect of the invention is very valuable in various fields.

The invention has been described in detail with particular reference to preferred embodiments, but it will be understood that variations and modifications can be effected within the scope of the invention as set forth in the appended claims.

What is claimed is:

1. An alloy composition for a lead free solder for connecting a connection lead to a material, consisting of:
   0.002 to 0.015% by mass of phosphorus;
   2.0 to 5.0% by mass of silver;
   0.01 to 2.0% by mass of copper; and
   tin.

2. A connection lead comprising:
   a copper strip or other strip conductor; and
   a plating provided on at least one side of the strip conductor;
   wherein said plating comprises a lead free solder, and the lead free solder consists of 0.002 to 0.015% by mass of phosphorus, 2.0 to 5.0% by mass of silver, 0.01 to 2.0% by mass of copper, and tin.

* * * * *